United States Patent
Chen et al.

(10) Patent No.: US 9,613,853 B2
(45) Date of Patent: Apr. 4, 2017

(54) COPPER WIRE AND DIELECTRIC WITH AIR GAPS

(71) Applicant: INTERNATIONAL BUSINESS MACHINES CORPORATION, Armonk, NY (US)

(72) Inventors: Fen Chen, Williston, VT (US); Jeffrey P. Gambino, Portland, OR (US); Zhong-Xiang He, Essex Junction, VT (US); Trevor A. Thompson, Jeffersonville, VT (US); Eric J. White, Charlotte, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/883,162

(22) Filed: Oct. 14, 2015

(65) Prior Publication Data
US 2016/0035621 A1 Feb. 4, 2016

Related U.S. Application Data

(60) Continuation of application No. 14/526,741, filed on Oct. 29, 2014, now Pat. No. 9,230,914, which is a
(Continued)

(51) Int. Cl.
*H01L 21/70* (2006.01)
*H01L 23/12* (2006.01)
(Continued)

(52) U.S. Cl.
CPC .... *H01L 21/76843* (2013.01); *H01L 21/2885* (2013.01); *H01L 21/7682* (2013.01);
(Continued)

(58) Field of Classification Search
CPC ......... H01L 21/70; H01L 23/12; H01L 29/40; H01L 23/52; H01L 29/00
(Continued)

(56) References Cited

U.S. PATENT DOCUMENTS 4,810,332 A 3/1989 Pan
5,254,493 A 10/1993 Kumar
(Continued)

OTHER PUBLICATIONS

Arnal et al., "Integration of a 3 Level Cu-SiO2 Air Gap Interconnect for Sub 0.1 micron CMOS Technologies", IEEE 2001, pp. 298-300.

*Primary Examiner* — Kimberly Rizkallah
*Assistant Examiner* — Brian Turner
(74) *Attorney, Agent, or Firm* — Steven Meyers; Andrew M. Calderon; Roberts Mlotkowski Safran Cole & Calderon, P.C.

(57) ABSTRACT

Approaches for fabricating copper wires in integrated circuits are provided. A method of manufacturing a semiconductor structure includes forming a wire opening in a mask. The method also includes electroplating a conductive material in the wire opening. The method additionally includes forming a cap layer on the conductive material. The method further includes removing the mask. The method still further includes forming spacers on sides of the conductive material. The method additionally includes forming a dielectric film on surfaces of the cap layer and the sidewall spacers.

18 Claims, 5 Drawing Sheets

Related U.S. Application Data division of application No. 14/083,929, filed on Nov. 19, 2013, now Pat. No. 9,159,671.

(51) Int. Cl.
*H01L 29/40* (2006.01)
*H01L 29/00* (2006.01)
*H01L 21/768* (2006.01)
*H01L 23/532* (2006.01)
*H01L 23/522* (2006.01)
*H01L 23/528* (2006.01)
*H01L 21/288* (2006.01)

(52) U.S. Cl.
CPC .. *H01L 21/76802* (2013.01); *H01L 21/76834* (2013.01); *H01L 21/76879* (2013.01); *H01L 21/76885* (2013.01); *H01L 23/528* (2013.01); *H01L 23/5222* (2013.01); *H01L 23/5226* (2013.01); *H01L 23/5329* (2013.01); *H01L 23/53238* (2013.01); *H01L 23/53295* (2013.01); *H01L 2924/0002* (2013.01)

(58) Field of Classification Search
USPC ........ 257/751, 532, 535, 640, 642, 43, 307, 257/758, 774; 438/648, 685, 559, 653
See application file for complete search history.

(56) References Cited

U.S. PATENT DOCUMENTS

| | | | |
|---|---|---|---|
| 6,077,767 A | 6/2000 | Hwang | |
| 6,140,234 A | 10/2000 | Uzoh et al. | |
| 6,423,629 B1 | 7/2002 | Ahn et al. | |
| 6,486,530 B1 | 11/2002 | Sasagawa et al. | |
| 6,709,562 B1 | 3/2004 | Andricacos et al. | |
| 6,881,668 B2 | 4/2005 | Lee et al. | |
| 7,071,532 B2 | 7/2006 | Geffken et al. | |
| 7,071,564 B1 | 7/2006 | Erb et al. | |
| 7,566,656 B2 | 7/2009 | Liu et al. | |
| 7,754,601 B2 | 7/2010 | Chen et al. | |
| 7,939,446 B1 | 5/2011 | Clevenger et al. | |
| 8,497,202 B1 | 7/2013 | Edelstein et al. | |
| 2002/0098673 A1 | 7/2002 | Yeh et al. | |
| 2003/0139036 A1* | 7/2003 | Sato | H01L 21/2885 438/669 |
| 2006/0223310 A1 | 10/2006 | Suzuki | |
| 2007/0246831 A1 | 10/2007 | Gabric et al. | |
| 2008/0019543 A1* | 1/2008 | Suzuki | H04R 19/005 381/174 |
| 2008/0026541 A1 | 1/2008 | Edelstein et al. | |
| 2008/0040697 A1* | 2/2008 | Chidambarrao | H01L 21/82380 257/510 |
| 2008/0128907 A1 | 6/2008 | Yang et al. | |
| 2009/0085173 A1* | 4/2009 | Boemmels | H01L 21/76814 257/635 |
| 2009/0298282 A1* | 12/2009 | Yun | H01L 21/7682 438/653 |
| 2010/0130001 A1* | 5/2010 | Noguchi | H01L 21/76811 438/627 |
| 2010/0136781 A1 | 6/2010 | Kulkarni et al. | |
| 2010/0155893 A1 | 6/2010 | Chen et al. | |
| 2011/0156009 A1* | 6/2011 | Manning | B82Y 10/00 257/40 |
| 2011/0254151 A1 | 10/2011 | Lin et al. | |
| 2012/0007231 A1 | 1/2012 | Chang | |
| 2012/0032344 A1 | 2/2012 | Usami | |
| 2012/0329267 A1 | 12/2012 | Horak et al. | |
| 2014/0112050 A1* | 4/2014 | Park | H01L 27/10882 365/72 |

* cited by examiner

COPPER WIRE AND DIELECTRIC WITH AIR GAPS

FIELD OF THE INVENTION

The invention relates to integrated circuits and, more particularly, to wires in integrated circuits and methods of manufacture.

BACKGROUND

As semiconductor designs continue marching towards smaller geometry, back end of line (BEOL) copper wire formation with lower dielectric constant material becomes a significant challenge. Damascene integration techniques are commonly used to form copper wires and vias. Conventional damascene integration methods involve forming trenches in an insulator layer, depositing a thin diffusion barrier layer and seed layer on surfaces of the trenches, electroplating to fill the trenches in the insulator layer, and planarizing, e.g., with chemical mechanical polish (CMP). As geometry becomes increasingly smaller, e.g., sub-micron, it is very difficult to sputter and plate copper material into tiny damascene trenches. Moreover, a significant amount of copper (Cu) wire thickness variation exists when Cu-CMP is employed.

SUMMARY

In a first aspect of the invention, there is a method of manufacturing a wire in an integrated circuit. The method includes forming a wire opening in a mask. The method also includes electroplating a conductive material in the wire opening. The method additionally includes forming a cap layer on the conductive material. The method further includes removing the mask. The method still further includes forming spacers on sides of the conductive material. The method additionally includes forming a dielectric film on surfaces of the cap layer and the sidewall spacers.

In another aspect of the invention, there is a method of forming a semiconductor structure. The method includes forming a via opening in a dielectric layer, wherein the via opening exposes a surface of a conductive feature. The method also includes forming a barrier layer on an upper surface of the dielectric layer, on surfaces of the via opening, and on the exposed surface of the conductive feature. The method further includes: forming a seed layer on the barrier layer; forming a mask on the seed layer; forming a wire opening in the mask and over the via opening; electroplating a conductive material on the seed layer in the via opening and the wire opening; and forming a cap layer on the conductive material. The method additionally includes: removing the mask; forming spacers on sides of the conductive material; removing exposed portions of the seed layer; removing exposed portions of the barrier layer; and forming a dielectric film on surfaces of the cap layer, the spacers, and the dielectric layer.

In another aspect of the invention, a semiconductor structure includes a wire that includes: a barrier layer; an electroplated material on and over the barrier layer; a cap layer on and over the electroplated material; and spacers on sidewalls of the electroplated material. The barrier layer includes a first conductive material. The cap layer includes a second conductive material different than the first conductive material. The spacers include an insulator material.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of an electroplated wire which comprises the structures of the present invention. In still further embodiments, a method in a computer-aided design system is provided for generating a functional design model of an electroplated wire. The method comprises generating a functional representation of the structural elements of the electroplated wire.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to wires in integrated circuits and methods of manufacture. According to aspects of the invention, a selective plating technique is utilized to form sub-micron wires and vias in an integrated circuit structure. In embodiments, the wires and vias are copper. In some aspects, metallic cap films are plated to protect the top surface of the copper wire, and a dielectric film spacer is used to minimize the lateral loss of the copper wire during seed layer removal. An optional copper oxidation step may be used to further minimize copper loss from the wire during seed layer removal. Additionally, internal air gaps may be formed in the dielectric that caps the wires, such that lower RC constants are achieved.

As used herein, the term via refers generally to an electrically conductive feature running substantially perpendicular to the upper surface of the semiconductor substrate. Also, the terms line, interconnect, and wire are used interchangeably, and refer generally to an electrically conductive feature running substantially parallel to the upper surface of the semiconductor substrate. Furthermore, as used herein, the term conductive refers to electrical conductivity, unless otherwise noted.

Figure 1:
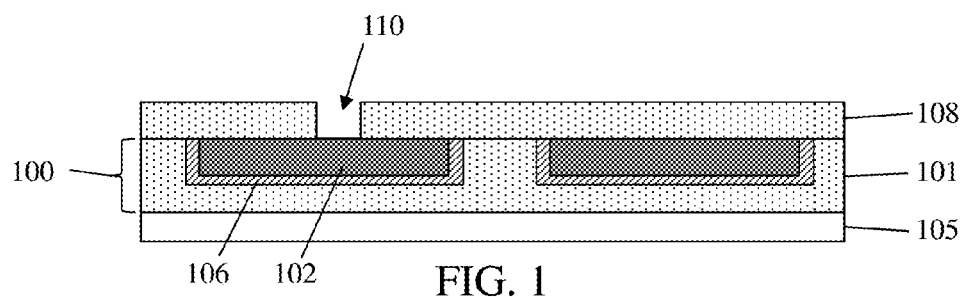
FIGS. 1-11 show views of structures and respective processing steps in accordance with aspects of the invention.

FIGS. 1-11 show processing steps and respective structures in accordance with aspects of the invention. Specifically, FIG. 1 shows a lower interconnect level 100 comprising a dielectric layer 101 and at least one conductive feature 102 formed in the dielectric layer 101. In embodiments, the at least one conductive feature 102 comprises at least one wire; however, the invention is not limited to wires in the lower interconnect level 100, and any desired conductive feature(s), e.g., vias, lines, etc., may be embedded in the dielectric layer 101.

As depicted in FIG. 1, the lower interconnect level 100 may be formed directly or indirectly on a surface of a substrate 105, e.g., an integrated circuit (IC) substrate. The substrate 105 may include a semiconducting material, an insulating material, a conductive material or any combination thereof. When the substrate 105 is comprised of a semiconducting material, any semiconductor such as, for example, Si, SiGe, SiGeC, SiC, Ge alloys, GaAs, InAs, InP and other III/V or II/VI or compound semiconductors can be used. In addition to these listed types of semiconducting materials, the present invention also contemplates cases in which the semiconductor substrate is a bulk substrate and also cases in which the semiconductor substrate is a layered semiconductor such as, for example, Si/SiGe, Si/SiC, silicon-on-insulator (SOI) or silicon germanium-on-insulator (SGOI).

When the substrate 105 is an insulating material, the insulating material can be an organic insulator, an inorganic insulator or a combination thereof including multilayers. When the substrate 105 is a conducting material, the substrate may include, for example, polySi, an elemental metal, alloys of elemental metals, a metal silicide, a metal nitride or combinations thereof including multilayers. When the substrate 105 comprises a semiconducting material, one or more semiconductor devices such as, for example, complementary metal oxide semiconductor (CMOS) devices can be fabricated thereon.

The dielectric layer 101 may include any interlevel or intralevel interconnect dielectric material including inorganic dielectrics or organic dielectrics. The dielectric material may be porous or non-porous. Some examples of suitable dielectrics that can be used as the dielectric layer 101 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material of the dielectric layer 101 typically has a dielectric constant that is about 4.0 or less, with a dielectric constant of about 2.8 or less being more typical. These dielectrics generally have a lower parasitic cross talk as compared with dielectric materials that have a higher dielectric constant than 4.0. The thickness of the dielectric layer 101 may vary depending upon the dielectric material used as well as the exact number of dielectrics within the lower interconnect level 100. Typically, and for normal interconnect structures, the dielectric layer 101 has a thickness from 50 nm to 500 nm, although the invention is not limited to these dimensions and any suitable thickness are also contemplated by the present invention.

The conductive feature 102 may be a wire or similar feature composed of any suitable conductive material, including but not limited to, Cu, Cu alloys, W, Al, etc. A diffusion barrier layer 106 may be employed around the conductive feature 102. The diffusion barrier layer 106 may be composed of, for example, Ta, TaN, Ti, TiN, or any other material or combination of materials that function as a barrier to prevent material of the conductive feature 102 from diffusing there-through.

Still referring to FIG. 1, there is an upper dielectric layer 108 formed over the dielectric layer 101 and the conductive feature 102. The upper dielectric layer 108 may be composed of any suitable material including those described with respect to dielectric layer 101, and may the same material or a different material than dielectric layer 101. In embodiments, the upper dielectric layer 108 has a sub-micron thickness, e.g., in the vertical direction, of about 50 nm to about 500 nm. Although not shown, there may be one or more capping layers formed between dielectric layer 101 and upper dielectric layer 108. The one or more capping layers may comprise, for example, oxide, nitride, oxynitride, etc.

As shown in FIG. 1, a via opening 110 is formed in the upper dielectric layer 108 (and any capping layers, if present) that exposes a portion of the upper surface of the conductive feature 102. The via opening 110 may be formed using conventional techniques, such as photolithographic masking and etching. For example, a photomask may be provided by forming a layer of photoresist material on the upper dielectric layer 108, exposing the photoresist material to a pattern of light, and developing the exposed photoresist material. An etching process, such as a reactive ion etch (RIE), may then be used to remove portions of the upper dielectric layer 108 (and any capping layers, if present) that are not covered by the photomask. After etching, the photomask may be removed using a conventional ashing or stripping process. In embodiments, the via opening 110 may have a sub-micron width, e.g., in the horizontal direction, of about 20 nm to about 200 nm.

Figure 2:
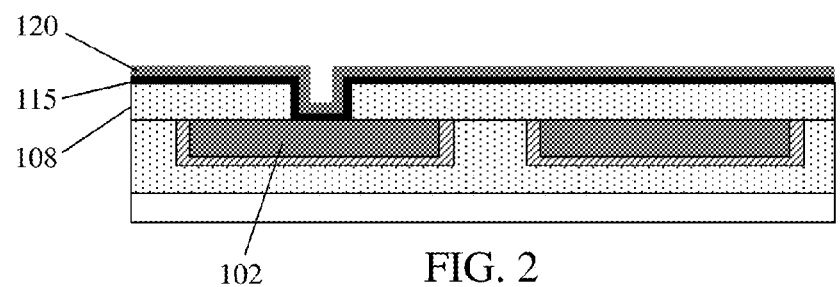

As shown in FIG. 2, a barrier layer 115 is formed on the upper dielectric layer 108 and the exposed surface of conductive feature 102. The barrier layer 115 may be formed using conventional semiconductor materials and processes. For example, the barrier layer 115 may comprise a conductive material such as TiN, TaN, etc., may have a thickness of about 2 nm to about 60 nm, and may be formed by sputtering or other suitable deposition process.

As further shown in FIG. 2, a seed layer 120 is formed on the barrier layer 115. The seed layer 120 may be formed using conventional semiconductor materials and processes. In embodiments, the seed layer 120 comprises copper that is deposited in any suitable manner, such as sputtering, physical vapor deposition (PVD), atomic layer deposition (AVD), etc. The seed layer 120 may have a thickness of about 5 nm to about 50 nm.

Figure 3:
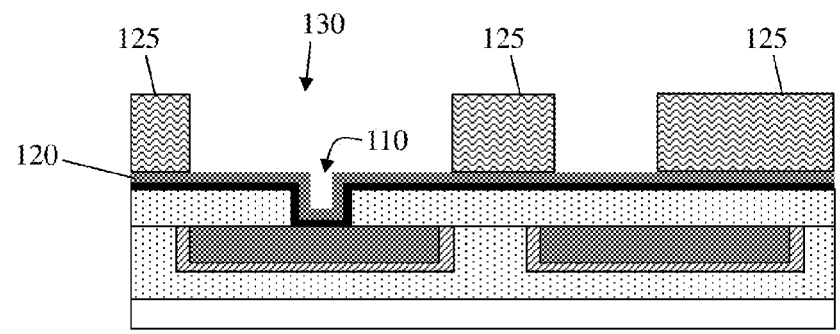

Next, as shown in FIG. 3, a mask 125 is formed on portions of the seed layer 120. In embodiments, the mask 125 comprises photoresist material that is patterned (e.g., exposed and developed) to form a wire opening 130 over the via opening 110.

Figure 4:
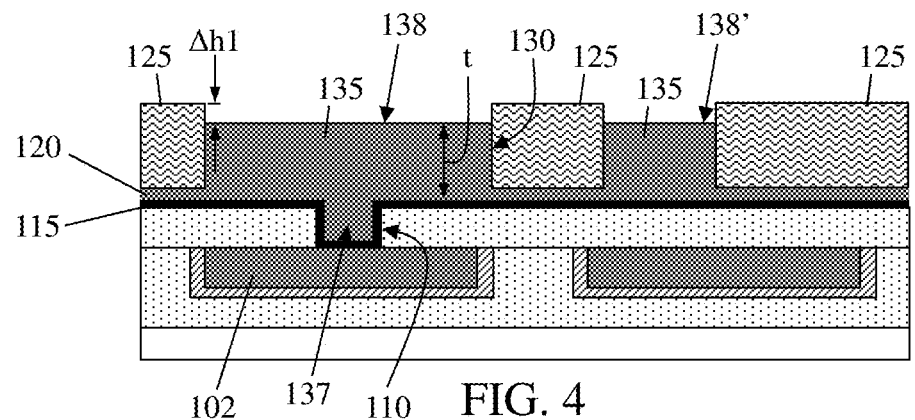

Next, as shown in FIG. 4, a conductive material 135 is electroplated in the via opening 110 and the wire opening 130. In a preferred embodiment, the conductive material 135 comprises or is composed of copper that is formed using a copper electroplating process. The conductive material 135 is formed to a height less than the height of the mask 125, as indicated by $\Delta h1$, which advantageously eliminates the need to perform CMP or other planarization processes on the conductive material 135. The height of the conductive material 135 may be controlled through the electroplating process. In embodiments, the combined thickness "t" of the seed layer 120 and the conductive material 135 above the top surface of the barrier layer 115 is about 500 nm or less, e.g., sub-micron, although other thicknesses may be used.

The resulting structure includes a via 137 and a wire 138 made up of the conductive material 135. The via 137 is over and electrically contacting the conductive feature 102, and the wire 138 is over and directly contacting the via 137. Additional wires, e.g., wire 138', may be formed simultaneously with wire 138 during the same processing steps, e.g., by appropriately patterning the mask 125 as shown in FIGS. 3 and 4.

Figure 5:
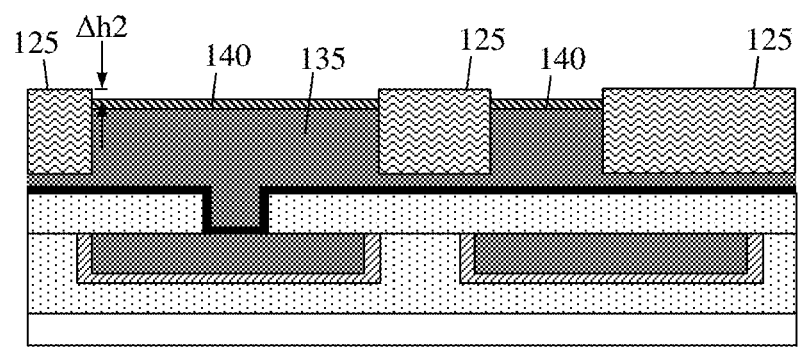

Next, as shown in FIG. 5, a cap layer 140 is formed on the upper surface of the conductive material 135. In embodiments, the cap layer 140 is a metal or metal alloy that is different than the material of the barrier layer 115. In a particular embodiment, the cap layer 140 comprises Ni (nickel), CoWP (cobalt-tungsten-phosphide) or other Co-containing material, which may be formed using an electroless plating process. The cap layer 140 may have a thickness of about 2 nm to about 10 nm, although other thicknesses may be used. In aspects of the invention, the cap layer 140 is formed to a height less than the height of the mask 125, as indicated by Δh2, which advantageously eliminates the need to perform CMP or other planarization processes on the cap layer 140.

Figure 6:
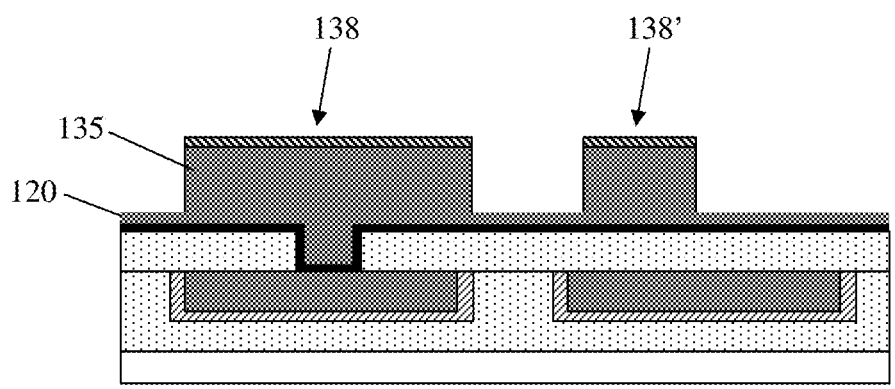

Next, as shown in FIG. 6, the mask 125 is removed. In embodiments, the mask 125 is removed using a low temperature process. For example, the mask 125 may be composed of photoresist material, and the mask removal may include low temperature stripping using a solvent as opposed to ashing. Removing the mask 125 exposes portions of the seed layer 120 and sidewalls of the conductive material 135 of the wires 138 and 138'.

In embodiments, before or after removing the mask 125, the conductive material 135, e.g., copper, is annealed. The anneal may take place between about 100° C. and about 250° C. for between about 10 minutes and about 1 hour, although any suitable anneal parameters may be used.

Figure 7:
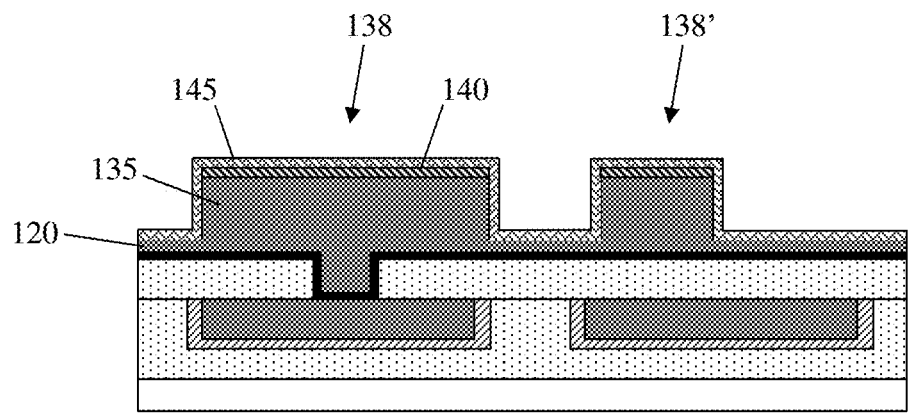

As shown in FIG. 7, a spacer layer 145 is formed over the wires 138 and 138' on the exposed surfaces of the cap layer 140, the conductive material 135, and the seed layer 120. In accordance with aspects of the invention, the spacer layer 145 is a different material than the cap layer 140. In embodiments, the spacer layer 145 comprises an insulator such as SiN, SiC, SiCN, etc., and is formed using a conformal deposition process, such as chemical vapor deposition (CVD), plasma enhanced chemical vapor deposition (PECVD), etc. In embodiments, the spacer layer 145 has a thickness of about 5 nm to about 50 nm.

Figure 8:
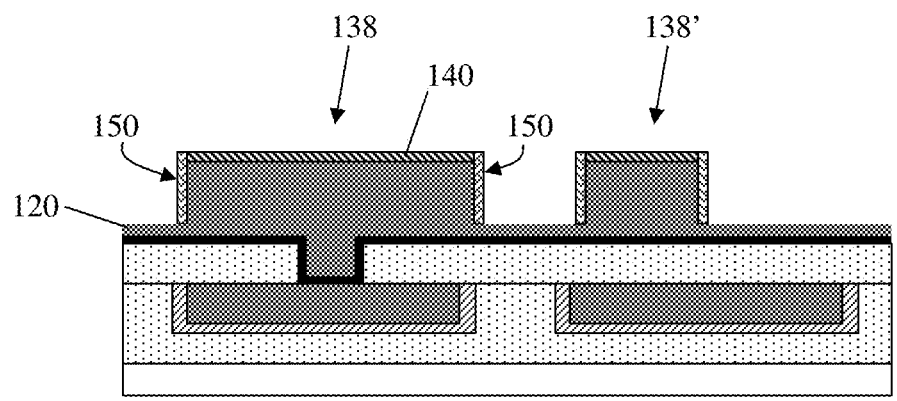

Next, as shown in FIG. 8, the spacer layer 145 is patterned such that remaining material of the layer forms sidewall spacers 150 on the vertical sides of the wires 138 and 138'. In embodiments, the spacer layer 145 is anisotropically etched, e.g., using an appropriate RIE process, to remove the horizontal portions of the spacer layer 145 while leaving the sidewall spacers 150 on the vertical sides of the conductive material 135. In particular embodiments, the RIE process is selective in that it removes material of the spacer layer 145 at a much higher rate than the cap layer 140 and the seed layer 120. The patterning of the spacer layer 145 thus exposes portions of the cap layer 140 and the seed layer 120.

Figure 9:
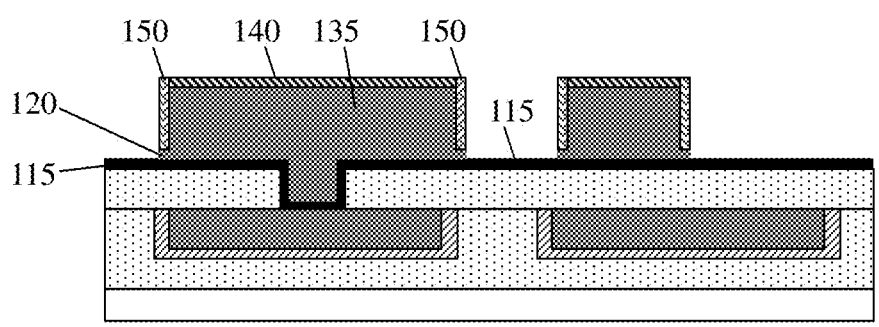

Next, as shown in FIG. 9, the exposed portions of the seed layer 120 are removed. In embodiments, the exposed portions of the seed layer 120 are removed using a wet etch that selectively removes the material of the seed layer 120 at a much faster rate than the cap layer 140 and the sidewall spacers 150. The sidewall spacers 150 thus minimize or eliminate altogether lateral loss of material from the sidewalls of the conductive material 135 during removal of the seed layer 120. Removing the seed layer 120 exposes portions of the barrier layer 115.

Optionally, the seed layer 120 is oxidized prior to its removal. In this embodiment, the etch used to remove the oxidized seed layer is tailored to the material of the oxidized seed layer, which further minimizes or eliminates lateral loss of material from the sidewalls of the conductive material 135 during removal of the oxidized seed layer.

Figure 10:
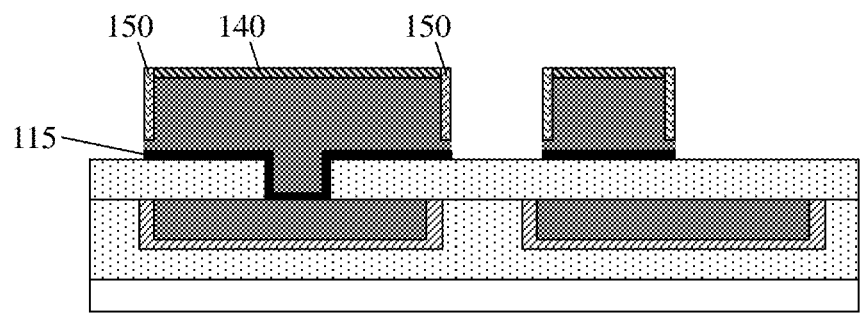

Next, as shown in FIG. 10, the exposed portions of the barrier layer 115 are removed. In embodiments, the exposed portions of the barrier layer 115 are removed using a wet etch or a dry etch that selectively removes the material of the barrier layer 115 at a much faster rate than the cap layer 140 and the sidewall spacers 150.

Figure 11:
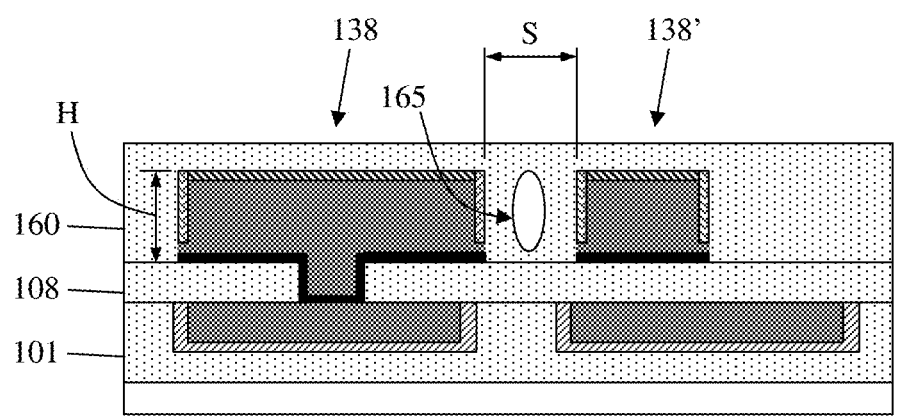

As shown in FIG. 11, a dielectric layer 160 is formed on the exposed surfaces of the semiconductor structure. The dielectric layer 160 may be composed of any suitable low-k or ultra low-k dielectric material including those described with respect to dielectric layer 101, and may the same material or a different material than dielectric layer 108. The dielectric layer 160 may be formed using suitable deposition processes, such as PECVD.

In aspects of the invention, a spacing "S" between the wires 138 and 138' is structured and arranged to be sufficiently small relative to a height "H" of the wires 138 and 138' such that an air gap (e.g., a void) 165 is formed in the dielectric layer 160 between the wires 138 and 138'. The air gap 165 has a lower dielectric constant than the material of the dielectric layer 160 and, thus, advantageously reduces capacitive coupling, e.g., cross-talk, between the wires 138 and 138'.

As described herein, implementations of the invention form copper wires using patterned plating rather than damascene processes. In this manner, fine pitch (e.g., sub-micron) copper wires are formed using a selective plating process. In embodiments, the fine pitch wires are provided with metal capping, a dielectric sidewall spacer, and air gaps between wires. In a particular embodiment, the barrier layer 115 comprises Ti or TiN, the wires 138 and 138' comprise electroplated copper formed using a patterned resist, the cap layer 140 comprises CoWP or Ni, the sidewall spacers 150 comprise SiN, SiC, SiCN, and there is an air gap 165 formed in the dielectric material 160 between the wires 138 and 138'.

Figure 12:
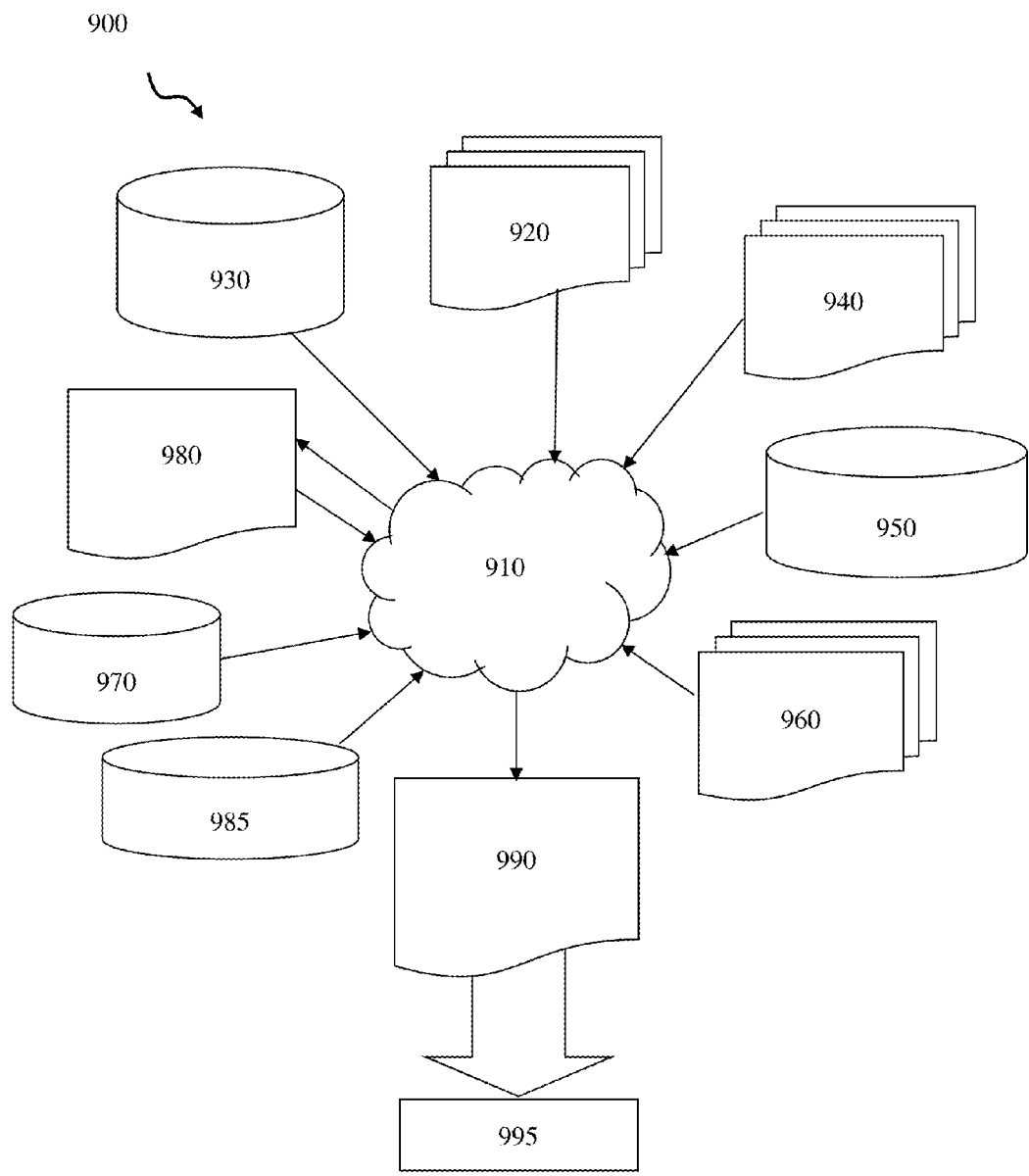
FIG. 12 is a flow diagram of a design process used in semiconductor design, manufacture, and/or test.

FIG. 12 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-11. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-11. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-11 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-11. In one embodiment, design structure 990 may comprise a compiled, executable HDL simulation model that functionally simulates the devices shown in FIGS. 1-11.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-11. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a semiconductor structure, comprising:
   forming a dielectric layer with a via opening;
   forming a wire comprising:
      forming a barrier layer on and over the dielectric layer;
      depositing an electroplated material on and over the barrier layer;
      forming a cap layer on and over the electroplated material; and
      depositing an insulator material on sidewalls of the electroplated material to form spacers on the sidewalls of the electroplated material; and
   forming an upper dielectric layer over and around the wire and directly contacting a top surface of the cap layer, the spacers, and a top surface of the dielectric layer with the via opening,
   wherein:
      the barrier layer comprises a first conductive material;
      the cap layer comprises a second conductive material different than the first conductive material;
      the spacers comprise the insulator material; and
      the spacers are formed directly on the sidewalls of the electroplated material.

2. The method of claim 1, further comprising:
   forming a second wire; and
   forming an air gap in the upper dielectric layer between the wire and the second wire.

3. The method of claim 2, wherein the second wire is on and contacting the barrier layer.

4. The method of claim 3, wherein:
   the second wire comprises a cap composed of a same material as the electroplated material; and
   the second wire comprises sidewall spacers composed of a same material as the insulator material.

5. The method of claim 1, wherein:
   the first conductive material comprises Ti or TiN;
   the second conductive material comprises Ni or CoWP; and
   the electroplated material comprises copper.

6. The method of claim 1, wherein the wire has sub-micron height and width.

7. The method of claim 1, wherein the electroplated material directly contacts a via in the via opening.

8. The method of claim 7, wherein the via electrically contacts another wire.

9. The method of claim 1, further comprising:
   forming a second wire on the barrier layer, wherein:
   the wire and the second wire have a same height; and
   a spacing between the wire and the second wire is less than the height.

10. The method of claim 9, further comprising:
    forming an air gap in the upper dielectric layer between the wire and the second wire.

11. The method of claim 1, wherein a top surface of the spacers is at a same vertical level as a top surface of the cap layer.

12. The method of claim 1, wherein:
    the electroplated material is formed within an opening in a mask; and
    the electroplated material is formed to a height less than the height of the mask.

13. A method of manufacturing a semiconductor structure, comprising:
    forming a wire comprising:
       forming a barrier layer;
       depositing an electroplated material on and over the barrier layer;
       forming a cap layer on and over the electroplated material; and
       depositing an insulator material on sidewalls of the electroplated material to form spacers on the sidewalls of the electroplated material,
    wherein:
       the barrier layer comprises a first conductive material;
       the cap layer comprises a second conductive material different than the first conductive material;
       the spacers comprise the insulator material;
       an uppermost top surface of the spacers is at a same horizontal plane as an uppermost top surface of the cap layer; and
       the spacers are formed directly on the sidewalls of the electroplated material.

14. The method of claim 13, wherein the cap layer comprises Ni(nickel) or CoWP (cobalt-tungsten-phosphide), and the method further comprises:
    forming a dielectric layer on and contacting the spacers and the cap layer.

15. The method of claim 14, further comprising:
    forming a lower dielectric layer with a via opening, and wherein:
    the barrier layer is on and contacting the lower dielectric layer;
    the barrier layer is in the via opening;
    the dielectric layer is on and contacting a top surface of the lower dielectric layer.

16. The method of claim 15, further comprising:
    forming a second wire on the barrier layer wherein: the wire and the second wire have a same height, and a spacing between the wire and the second wire is less than the height; and
    forming an air gap in the dielectric layer between the wire and the second wire.

17. A method of manufacturing a semiconductor structure, comprising:
    forming a wire comprising:
       forming a barrier layer;
       depositing an electroplated material on and over the barrier layer;
       forming a cap layer on and over the electroplated material; and
       depositing an insulator material on sidewalls of the electroplated material to form spacers on the sidewalls of the electroplated material;
    wherein:
       the barrier layer comprises a first conductive material; and
       the cap layer comprises a second conductive material different than the first conductive material;
       the spacers comprise the insulator material;

an uppermost top surface of the spacers is at a same horizontal plane as an uppermost top surface of the cap layer;
forming a lower dielectric layer with a via opening, wherein:
the barrier layer is on and contacting the lower dielectric layer;
the barrier layer is in the via opening;
the dielectric layer is on and contacting a top surface of the lower dielectric layer;
forming a second wire on the barrier layer wherein:
the wire and the second wire have a same height, and a spacing between the wire and the second wire is less than the height; and
forming an air gap in the dielectric layer between the wire and the second wire;
wherein:
the electroplated material is formed within a first opening and a second opening of a mask to form the wire and the second wire, respectively;
the cap layer is formed on and over the electroplated material of the wire and the second wire; and
the cap layer on and over the electroplated material is formed to a height less than the height of the mask.

18. A method of manufacturing a semiconductor structure, comprising:
forming a dielectric layer with a via opening;
forming a wire comprising:
forming a barrier layer on and over the dielectric layer;
depositing an electroplated material on and over the barrier layer;
forming a cap layer on and over the electroplated material; and
depositing an insulator material on sidewalls of the electroplated material to form spacers on the sidewalls of the electroplated material; and
forming an upper dielectric layer over and around the wire and directly contacting a top surface of the cap layer, the spacers, and a top surface of the dielectric layer with the via opening,
wherein:
the barrier layer comprises a first conductive material;
the cap layer comprises a second conductive material different than the first conductive material;
the spacers comprise the insulator material;
the electroplated material is formed within an opening in a mask;
the electroplated material is formed to a height less than the height of the mask; and
the cap layer is formed on and over the electroplated material and is formed to a height less than the height of the mask.

* * * * *